United States Patent [19]
Moh

[11] Patent Number: 5,691,059
[45] Date of Patent: Nov. 25, 1997

[54] GLASS AND GLASS-CERAMIC BUBBLES HAVING AN ALUMINUM NITRIDE COATING

[75] Inventor: Kyung H. Moh, Woodbury, Minn.

[73] Assignee: Minnesota Mining and Manfacturing Company, St. Paul, Minn.

[21] Appl. No.: 560,794

[22] Filed: Nov. 21, 1995

[51] Int. Cl.$^6$ .................................................. B32B 5/16
[52] U.S. Cl. ..................... 428/404; 427/215; 428/406; 428/441
[58] Field of Search ........................ 428/403, 404, 428/406, 325, 426, 441; 427/212, 215

[56] References Cited

U.S. PATENT DOCUMENTS

| | | | |
|---|---|---|---|
| 4,100,140 | 7/1978 | Zahir et al. | 526/90 |
| 4,349,456 | 9/1982 | Sowman | 252/317 |
| 4,391,646 | 7/1983 | Howell | 106/97 |
| 4,505,720 | 3/1985 | Gabor et al. | 51/295 |
| 4,608,434 | 8/1986 | Shimp | 528/422 |
| 4,618,525 | 10/1986 | Chamberlain et al. | 428/209 |
| 4,769,440 | 9/1988 | Hefner, Jr. | 528/322 |
| 4,871,401 | 10/1989 | Arai et al. | 148/14 |
| 4,882,370 | 11/1989 | Jordan et al. | 523/215 |
| 4,946,908 | 8/1990 | Chu et al. | 525/426 |
| 5,073,526 | 12/1991 | Enloe et al. | 501/96 |
| 5,077,241 | 12/1991 | Moh et al. | 501/84 |
| 5,098,781 | 3/1992 | Minnick et al. | 428/313.5 |
| 5,102,749 | 4/1992 | Enloe et al. | 428/698 |
| 5,108,958 | 4/1992 | Moh et al. | 501/39 |
| 5,126,192 | 6/1992 | Chellis et al. | 428/323 |
| 5,139,856 | 8/1992 | Takeuchi et al. | 428/216 |
| 5,183,972 | 2/1993 | Duane et al. | 174/251 |
| 5,190,738 | 3/1993 | Parent | 423/412 |
| 5,204,289 | 4/1993 | Moh | 501/5 |
| 5,214,005 | 5/1993 | Yamakawa et al. | 501/32 |
| 5,232,775 | 8/1993 | Chamberlain et al. | 428/323 |

FOREIGN PATENT DOCUMENTS 0 476 954 A1  3/1992  European Pat. Off. .

OTHER PUBLICATIONS

PCT International Search Report, Jan. 23, 1997.
Aluminum/aluminum–nitride sputter deposition on the inertial fustion target using the pulsed-gas process; *Journal of Vacuum Science & Technology*; May–Jun. 1985; pp. 1201–1203.

*Primary Examiner*—H. Thi Le
*Attorney, Agent, or Firm*—Gary L. Griswold; Walter N. Kirn, Jr.; Gregory D. Allen

[57] ABSTRACT

A composite bubbles comprising a silicate glass bubble or a bubble of silicate glass-ceramic having an aluminum nitride coating thereon; and a method of making the same. In another aspect, composite articles (electronic substrate materials) having the composite bubbles therein are disclosed.

28 Claims, 1 Drawing Sheet

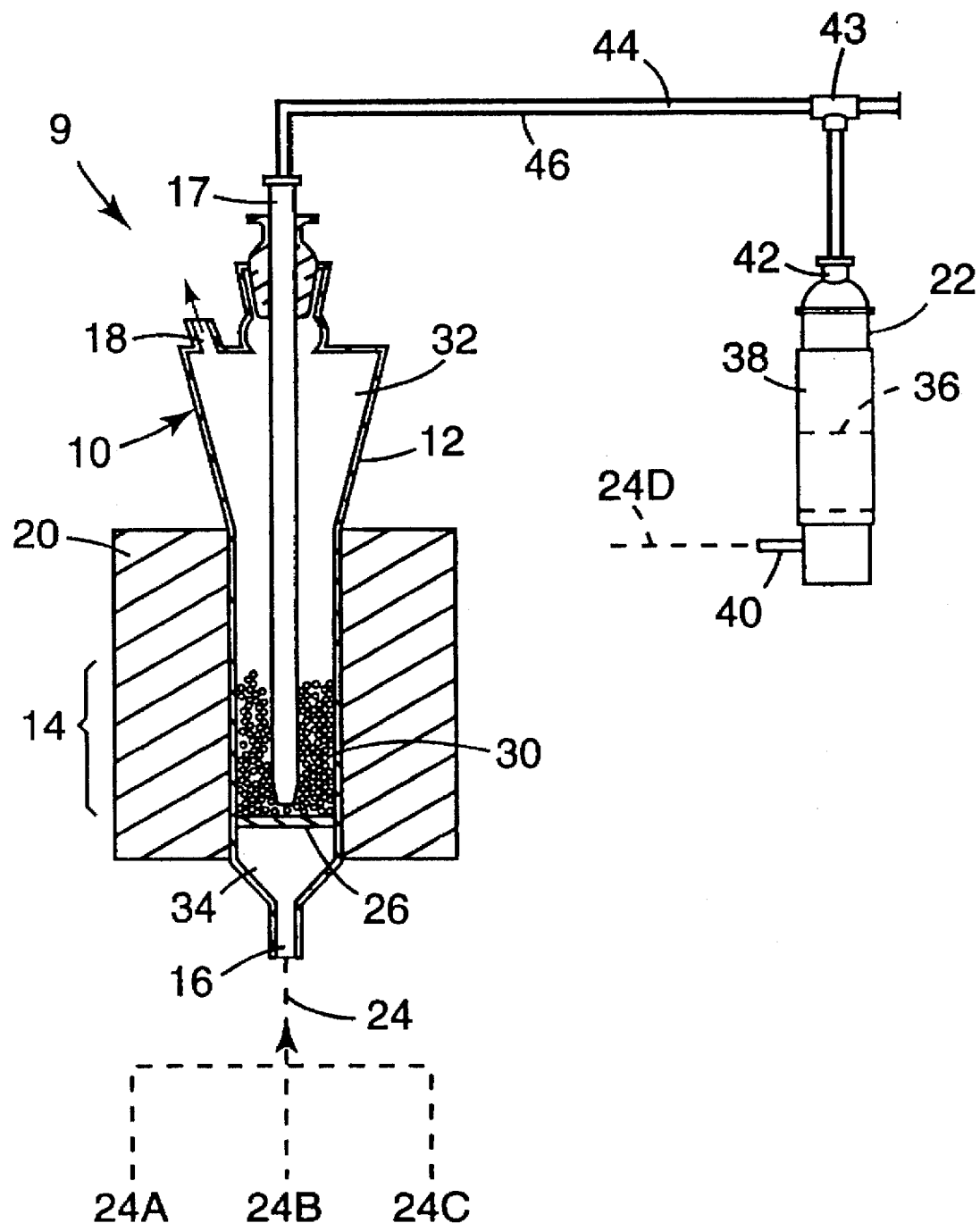

GLASS AND GLASS-CERAMIC BUBBLES HAVING AN ALUMINUM NITRIDE COATING

FIELD OF THE INVENTION

The present invention relates to glass and glass-ceramic bubbles (also known as hollow microspheres) having an aluminum nitride coating thereon, and a method for making the same. In another aspect, the present invention relates to electronic substrate materials having the aluminum nitride coated bubbles incorporated therein.

DESCRIPTION OF RELATED ART

Important properties for electronic substrates typically include mechanical properties such as strength and elastic modulus, electrical properties such as dielectric constant, and thermal properties such as thermal conductivity.

One common approach for lowering the dielectric constant of a material is to incorporate air (e.g., via pores or porosity) therein. A typical problem associated with this technique, however, is the undesired adsorption of water into the material due to the open pores on the surface of the material.

The undesirable adsorption of water may be minimized by incorporating glass, crystalline ceramic, and/or glass-ceramic bubbles into the substrate material. The air is sealed inside the bubbles, and therefore moisture adsorption, even in high humidity conditions, can be significantly reduced.

For example, electronic substrate materials comprising glass, crystalline ceramic, or glass-ceramic bubbles in a glass, crystalline ceramic, or glass-ceramic matrix are known, as are electronic substrate materials comprising a polymeric matrix with glass bubbles distributed therein. A problem associated with such substrate materials is poor thermal conductivity, which limits the density of electronic components that can be placed on a computer board. Further, the poor thermal conductivity may present an increased risk of fire, although the use of fire retardants may reduce such risk.

It is also known that materials useful for electronic substrates can be formed by dispersing aluminum nitride (AlN) powder into polymeric resin. While the addition of AlN powder increases the thermal conductivity of the substrate, it also greatly increases the density, as well as the cost. Further, the presence of solid aluminum nitride particles make drilling holes through the substrate difficult. Moreover, the addition of such dense particles to lower density resins can result in non-homogeneously mixed materials.

In another aspect, it is known to coat aluminum nitride onto flat substrates via vapor phase methods such as chemical vapor deposition (CVD), physical vapor deposition (PVD), or sputtering. Further, organ-metallic aluminum compounds have been used to generate thin films of AlN in various chemical vapor deposition systems. Aluminum nitride coated substrates produced by these methods, however, are typically expensive because of the processing required.

SUMMARY OF THE INVENTION

The present invention provides a composite bubble comprising:
(a) one of (i) a bubble of silicate glass having an outer surface, and having a softening point up to 900° C. (850° C., 800° C., or even 750° C.); or (ii) a bubble of silicate glass-ceramic having an outer surface, and including silicate glass (preferably at least 2% by weight silicate glass) having a softening point up to 900° C. (850° C., 800° C., or even 750° C.); and
(b) aluminum nitride coated on (100%) of the outer surface of the bubble.

In another aspect, the present invention provides a method for making a plurality of free flowing composite bubbles, the method comprising the step of:
(a) providing a plurality of bubbles, the bubbles being selected from the group consisting of (i) silicate glass bubbles having a softening point up to 900° C. (850° C., 800° C., or even 750° C.), and having an outer surface, (ii) silicate glass-ceramic bubbles including silicate glass (preferably at least 2% by weight silicate glass) having a softening point up to 900° C. (850° C., 800° C., or even 750° C.), and having an outer surface, and (iii) combinations thereof; and
(b) depositing aluminum nitride on the plurality of bubbles by chemical vapor deposition at a temperature below the softening point of the silicate glass to provide a plurality of free flowing composite bubbles each comprising one of the bubbles with aluminum nitride coated onto the outer surface (typically at least 90%, preferably, at least 100% of the outer surface) of each of the bubbles.

In this application:

"amorphous" refers to a material having no discernible x-ray diffraction pattern;

"polycrystalline" refers to a material having crystalline regions having a discernible x-ray diffraction pattern;

"aluminum nitride" refers to either polycrystalline aluminum nitride (the crystalline form of AlN that exhibits the Wurtzite crystal structure) or amorphous and polycrystalline aluminum nitride;

"glass" is refers to an inorganic product of fusion that has cooled to a rigid condition without crystallizing (i.e., has no discernible x-ray diffraction pattern);

"ceramic" refers to inorganic material (e.g., metal oxides) consolidated by the action of heat, and typically containing at least some crystallized regions;

"glass-ceramic" refers to a composite material having a large (preferably, 95 to 98) volume percent of very small (preferably, smaller than about 1 micrometer) crystalline ceramic phase admixed with a small amount of glass phase making a composite essentially free of porosity (although a crystalline ceramic material that has been densified via liquid phase sintering may have a very small amount of an amorphous or glassy phase at the grain boundaries, such a material is not referred to by those skilled in the art as a glass-ceramic);

"devitrify" means to convert, partially or completely, from a glassy to a crystalline state;

"silicate glass" refers to a glass comprising at least fifty percent by weight $SiO_2$, based on the total weight of the glass;

"silicate glass-ceramic" refers to a glass-ceramic comprising at least fifty percent by weight $SiO_2$, based on the total weight of the glass-ceramic; and "softening point" refers to the temperature at which a glass in the form of a 0.235 mm long fiber having a 0.55–0.75 mm diameter, at a heating rate of 5° C./min., elongates at a rate of 1 mm/min. under its own weight)

"free flowing" as used in connection with a plurality of bubbles means the plurality of bubbles can move about and contact each other without agglomerating;

"epoxy resin" refers to an uncured composition comprising polyepoxide, a curing agent, and optional additives such as fillers, pigments, and antioxidants, that can be cured to provide a cured epoxy resin; and "polyepoxide" refers to a molecule that contains more than one

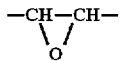

group.

A plurality of composite bubbles according to the present invention can be bonded together with an epoxy resin to form a composite article useful, for example, as an electronic substrate material, thermal insulation and sound insulation. Typically, an electronic substrate material formed using composite bubbles according to the present invention has a higher thermal conductivity than a substrate material formed using uncoated bubbles.

BRIEF DESCRIPTION OF THE DRAWING

The FIGURE is a schematic of an apparatus suitable for preparing composite bubbles according to the present invention.

DETAILED DESCRIPTION OF PREFERRED EMBODIMENTS

Composite bubbles according to the present invention typically have improved toughness, higher thermal conductivity, higher mechanical strength, better resistance to attack by molten metals, better chemical inertness, better hermetic sealing, and higher electrical resistivity than uncoated bubbles.

A schematic of an apparatus suitable for preparing composite bubbles according to the present invention is shown in the FIGURE. Apparatus 9 includes fluidized bed reactor 10 comprising quartz tube 12 having a reaction zone 14, gas inlets 16 and 17, and gas outlet 18. Apparatus 9 includes clamshell furnace 20 surrounding reaction zone 14, reactive gas generator 22, and hydrogen gas source 24A, nitrogen gas source 24B, and ammonia gas source 24C (not shown).

Tube 12 is filled with quartz frit 26 which supports bubbles to be coated 30 in reaction zone 14. Collection chamber 32 at the upper portion of quartz tube 12 prevents bubbles 30 from flowing out of reactor 10 when fluidizing gases are introduced as described below. Lower portion 34 of quartz tube 12 serves as a mixing chamber for incoming gases from gas inlet 16. Furnace 20 is a conventional temperature-controlled, resistance-heated vertical furnace.

Reactive gas generator 22 contains solid aluminum chloride ($AlCl_3$) 36 which is heated by heating tape 38 wrapped around generator 22. Generator 22 has gas inlet 40 and gas outlet 42. Gas outlet 42 is connected to gas supply line 44. Gas supply line 44 is connected to gas inlet 17 of quartz tube 12, which extends down into bubbles 30 (in reaction zone 14). Stainless steel tube 44 is heated by heating tape 46. When generator 22 is in use, hydrogen gas from gas source 24D (not shown) passes over heated solid aluminum chloride 36, generating $AlCl_3$ vapor which is carried by the hydrogen gas through heated stainless steel tube 44 and into gas inlet 17. Gas supply line 44 is also connected to T-line 43, which in turn is connected to nitrogen gas supply line 24B.

Gas inlet 16 of tube 12 is connected by stainless steel tubing 24 to hydrogen, nitrogen and ammonia gas sources 24A, 24B, and 24C, respectively (not shown).

The apparatus shown in the FIGURE is typically used as follows. Nitrogen gas is supplied to tube 12 through gas inlets 16 and 17 to fluidize bubbles 30, which has been heated (typically to at least 550° C.) with furnace 20 to a temperature sufficient to produce AlN from the reactive gases. The supply of nitrogen gas is then turned off, and reactive gases (i.e., hydrogen and ammonia from gas sources 24A and 24C, respectively) are then fed to tube 12 through gas inlet 16 and reactive gases (i.e., aluminum chloride vapor and hydrogen) through gas inlet 17. The combined flow rate of the reactive gases is sufficient to maintain the fluidization of bubbles 30. The reactive gases mix in reaction zone 14, and, while such gases feed into tube 12, fluidized bubbles 30 are continually heated by furnace 20 so that aluminum nitride is deposited from the reactive gases onto outer surfaces of bubbles 30.

It may be desirable to remove organic residue (if present) from the surface of the bubbles. Such residue can be removed, for example, by degreasing and/or etching techniques known in the art. In a preferred method, the residue can be removed by sequential immersion in each of the following baths for 10 minutes each: trichloroethylene, ethanol (EtOH), deionized $H_2O$, 2% hydrofluoric acid (HF), and deionized water. The bubbles are dried in an oven at 100° C. for 2 hours before loading into the quartz tube 12 which, typically, has an internal diameter of 5.1 cm and is 41 cm long.

The rate of flow of nitrogen gas into the reactor tube 12 to fluidize bubbles 30 is typically about 1-2 liter/min. (e.g., 1.5 liter/min.). The temperature to which bubbles 30 are heated under the flow of nitrogen is typically in the range of from about 450° C. to about 700° C. Preferably, the nitrogen flow rate is gradually reduced as the temperature increases during the initial heating.

When the reactive gases are supplied to reactor tube 12, the combined flow rate of the gases typically is about 1-2 liter/min. (e.g., 1.5 liter/min.). The flow rate of ammonia into reactor tube 12 is typically in the range from about 0.2 to about 2 liter/min. (e.g., about 0.5 liter/min.). In reactive gas generator 22, hydrogen gas is passed at a flow rate in the range of from about 0.3 to about 1 liter/min. over solid aluminum chloride 36 which is heated to the sublimation temperature of $AlCl_3$ (about 150° C.).

Under the flow of the reactive gases, silicate glass (or silicate glass-ceramic) bubbles 30 are typically heated to a temperature in the range from about 550° C. to 900° C., but below the softening point of the silicate glass, for a period within the range of 10 minutes to 3 hours. At the same time, the reactive gases are heated in reaction zone 14 by furnace 20. Although not wishing to be bound by theory it is believed the following reaction occurs to provide AlN: $AlCl_3(g)+NH_3(g) \rightarrow AlN+3HCl(g)$. Further, it is believed that mixing of the aluminum and nitrogen compounds (e.g., $AlCl_3$ and $NH_3$) usually forms a range of aluminum chloride-ammonia complexes and that ammonolysis conversion of the aluminum chloride-ammonia complex into AlN and HCl takes place in the fluidized reaction chamber.

As the temperature in reaction zone 14 increases, a lower combined flow rate of the reactive gases (e.g., down to about 1.3 liter/min.) may be sufficient to maintain fluidization of bubbles 30.

The aluminum nitride coatings formed on the bubbles under the conditions described above typically have thicknesses of about 0.1 to about 1.5 micrometer. The coating thickness typically increases with increasing temperature, deposition time, and/or flow rate of the reactive gases. The thickness of the aluminum nitride coatings can be measured, for example, by Scanning Electron Microscopy (SEM) and by Auger Electron Spectroscopy (AES). The composite bubbles can also be examined using optical microscopy, scanning electron microscopy (SEM), and reflection electron diffraction.

The ammonia gas used in the process described above serves as reactive nitrogen source. Other suitable reactive nitrogen sources are include azides and hydrazine, although such sources can be hazardous to handle. The aluminum source is preferably aluminum trichloride (as described above). Although organometallic aluminum compounds are also suitable, they can be hazardous to handle.

Preferably, silicate glass (or silicate glass-ceramic) bubbles 30 are coated with aluminum nitride in reactor tube 12 in a two-step deposition process, first at a temperature in the range from about 500° C. to about 850° C., but which is lower than the softening point, and then at a temperature in the range from about 550° C. to 900° C. Sufficient coating is deposited during the first step to prevent agglomeration of the bubbles due to softening of the glass. Coating deposition tends to be faster at higher temperatures and so, in some cases, it may be desirable for a greater part of the deposition process to be run at the higher temperature (e.g., in the range from about 800° C. to 900° C.

The use of this two-step coating method allows glass bubbles to be coated at a rapid rate. A single low temperature (<700° C.) deposition method would require longer deposition times to produce the desired coating thickness, and a single high temperature deposition step would soften the bubbles, leading to agglomeration. During the coating process, the glass bubbles may be heated sufficiently to devitrify at least a portion of the glass. Glasses containing silica tend to crystallize (forming cristobalite) at about 800° C. Devitrification may be accompanied by slight dimensional changes in the bubbles. Typically, however, such changes do not affect the coating process or the homogeneity of the coating on the bubbles.

Suitable silicate glass bubbles, which are preferably are rigid, crushable, free-flowing, smooth-surfaced, colorless, transparent, and spherical, can be made by techniques known in the art (see, e.g., U.S. Pat. Nos. 4,391,646 (Howell) and 4,767,726 (Marshall), the disclosures of which are incorporated herein by reference).

Glass bubbles of suitable composition which should be identifiable by those skilled in the art can be converted to glass-ceramic bubbles using conventional techniques. In another aspect, some glass bubbles are converted to glass-ceramic bubbles during the AlN coating step. The conversion of the glass to a glass-ceramic depends, for example, on the composition of the glass and the heating conditions (typically time and temperature) to which the bubbles are subjected.

Preferably, the bubbles are made of silicate glass or glass-ceramic comprising, on a theoretical oxide basis, about 60–95 percent by weight $SiO_2$, about greater than zero to about 15 percent by weight $Na_2O$, and greater than zero to about 10 percent by weight $B_2O_3$, based on the total weight of the silicate glass or glass-ceramic. Other preferred silicate glass or glass-ceramic compositions comprise about 60–95 percent by weight $SiO_2$ and greater than zero to about 10 percent by weight CaO.

In another aspect, numerous glass compositions include, on a theoretical oxide basis, boria ($B_2O_3$) and silica ($SiO_2$). These oxides can be mixed together in varying percentages to form borosilicate glasses. Typically, soda ($Na_2O$) and lime (CaO) are also present in borosilicate glasses. Other additives such as $P_2O_5$, ZnO, $Fe_2O_3$ can also be present. Such other additives are used, for example, to alter the melt temperature or the color of the glass.

Although not wishing to be bound by theory, it is believed that the presence of CaO, in, for example, borosilicate glasses, acts as a sintering agent during the formation of aluminum nitride, allowing formation of the coating at lower temperatures. Sintering agents are known to reduce the temperature at which crystallization occurs. It is known in the art, for example, that alkaline earth and rare earth oxides (e.g., yttria ($Y_2O_3$)) act as sintering aids. Therefore, if yttria were incorporated into a glass used for making bubbles it may act as a sintering aid for the aluminum nitride.

The bubbles preferably have particle sizes wherein 90% by volume are in the range from about 2 to about 200 micrometers. Small bubbles tend to be more difficult to coat because their relatively light weight makes it easier for them to flow out of the fluidized bed reactor during the coating process. On the other hand, excessively large bubbles make it difficult to establish or maintain a fluidized bed. The wall thickness of the bubbles typically ranges from 0.5 (for small bubbles (i.e., less than about 5 micrometers in diameter)) to 2 micrometers for large bubbles (i.e., bubbles greater than 5 micrometers in diameter).

Suitable glass bubbles are also available, for example, under the trade designation "ECCOSPHERES" from Grace Syntactics of Canton, Mass. Such Grace Syntactics glass bubbles are available in a range of compositions comprising silica, boria, soda, and barium oxide being under the product numbers "SDT-60" (by weight, 93% $SiO_2$, 3% $B_2O_3$ 2% $NaO_2$, and 1% BaO; average particle size of 20 micrometers), "SDT-28" (same composition as "SDT 60"; average particle size of 40 micrometers, and "FTD-202" (same composition as "SDT 60"; average particle size of 60 micrometers). Glass bubbles comprising silica, soda, and boria, are available, for example, from Grace Syntactics under the trade designations "ECCOSPHERE R" (by weight, 70% $SiO_2$, 25% $NaO_2$, and 5% $B_2O_3$) and "ECCOSPHERE SI" (by weight, 95% $SiO_2$, 1% $NaO_2$, and 4% $B_2O_3$).

Other suitable silicate glass bubbles are commercially available under product number "B38/4000" and "D32/4500" from the 3M Company of St. Paul, Minn. Those bubbles comprise, by weight, 75–80% $SiO_2$, 5–8% CaO, 8–12 $Na_2O$, 0–1% $P_2O_5$, 1–3% ZnO, and less than 0.5% $SO_3$, and have an average particle size of 45 micrometers and 35 micrometers, respectively. Sodium borosilicate glass bubbles are commercially available, for example, under the trade designation "Q-CEL HOLLOW MICROSPHERES" (by weight, 67–70% $SiO_2$, 20–22% $Na_2O$, 6.9–10.7% $B_2O_3$, 0.07–0.1% $Al_2O_3$, and 0.6–0.7% $SO_3$; average particle size of 75 micrometers) from PQ Corporation of Valley Forge, Pa.

Composite bubbles according to the invention having glass bubbles typically are transparent for coating thicknesses of up to about 0.1 micrometer (1000° A). For coating thicknesses exceeding 0.1 micrometer, composite bubbles according to the invention are translucent to opaque.

Typically, the thickness of the AlN coating is less than 1.5 micrometer. Preferably, the thickness is in the range from about 0.1 to about 1.5 micrometer, more preferably, in the range from about 0.1 to about 0.3 micrometer. Such coating thicknesses are typically associated with good properties (e.g. thermal conductivity) and are achieved at reasonable deposition times (i.e., less than about one hour). The aluminum nitride is polycrystalline and exhibits a Wurtzite structure (i.e., a crystalline (hexagonal) form of aluminum nitride), although amorphous AlN may also be present. The good thermal conductivity properties are believed to result from the polycrystalline form of AlN. Scanning electron photomicrographs of composite bubbles according to the invention show that the aluminum nitride has a columnar microstructure. In another aspect, composite bubbles according to the invention are free-flowing, smooth, and spherical.

Composite bubbles according to the invention can be mixed with a resin material and formed into a composite article (e.g., a substrate for electronic applications). The size and size distribution of the composite bubbles chosen is dependent on the desired properties of the composite article. A narrower size distribution tends to provide a composite article having more homogeneous and more uniform properties. For a typical electronic substrate application, the size of the uncoated bubbles is in the range from about 2 to about 40 micrometers (e.g., about 10 micrometers). Such sizes tend to maximize the loading of the composite bubbles in the composite article, which tends to minimizes the weight of the composite and maximize the amount of aluminum nitride present, and yet still provide the composite article with good strength.

The composite article according to the present invention can be made, for example, by mixing a resin (e.g., an epoxy resin) and the composite bubbles together. The bubble/resin mixture is preferably degassed under vacuum with stirring to remove all air bubbles. After degassing, the mixture can be shaped and cured (e.g., the mixture can be poured into a mold and cured by heating). The cure conditions for the resin are dependent on the chemistry of the resin. Further curing can accomplished or assisted using techniques known in the art. For example, resins can be cured by the addition of curing agents (such as acidic compounds (e.g., Lewis acids) or basic compounds (e.g., amines)), heat, and/or electron beam irradiation. Although powdered resins are useful in preparing the composite article according to the present invention, it is generally more convenient to mix a liquid resin with the composite bubbles because it is typically easier to more uniformly distribute the composite bubbles in the resin.

Suitable resins include those known in the art for making electronic substrates, including bismaleimide resins such as those described in U.S. Pat. Nos. 4,100,140 (Zahir et al) and 4,946,908 (Chu, et al), the disclosure of which is incorporated herein by reference; cyanate ester resins (see, e.g., U.S. Pat. No. 4,608,434 (Shimp), the disclosure of which is incorporated herein by reference; mixtures of cyanate and maleimide resins such as those described in U.S. Pat. No. 4,769,440 (Hefner), the disclosure of which is incorporated herein by reference; and epoxy resins such as those described in U.S. Pat. No. 5,183,972 (Duane, et al), the disclosure of which is incorporated herein by reference.

Commercially available poly epoxide resins include epoxy resins such as diglycidylether of bisphenol A (available, for example, from Dow Chemical Co. of Midland, Mich. under the trade designation "QUATREX 1010") and fluorene epoxy (available, for example, under the trade designation "EPON HPT-1079" from Shell Chemical Co. of Houston, Tex.).

The epoxy resin/bubble mixtures or composite article can be laminated to fabric (e.g., fiberglass or polyimide), metallic films, or polymeric films for reinforcement. Methods for making such constructions are known in the art and are described, for example, in U.S. Pat. No. 5,126,192 (Chellis et al.), the disclosure of which is incorporated by reference.

The cured resin/bubble material can be die cut to the desired shape using techniques known in the art.

Objects and advantages of this invention are further illustrated by the following examples, but the particular materials and amounts thereof recited in these examples, as well as other conditions and details, should not be construed to unduly limit this invention. All parts and percentages are by weight unless otherwise indicated.

EXAMPLE

Examples 1–9 illustrate the preparation of composite bubbles according to the invention, at different deposition temperatures and conditions. The apparatus used for Examples 1–9 is shown schematically in the FIGURE.

Example 1

Silicate glass bubbles (75–80% $SiO_2$, 5–8% CaO, 8–12% $Na_2O$, 0–1% $P_2O_5$, 1–3% ZnO, and less than 0.5% $SO_3$) (ranging in diameter from 10 to 200 micrometers; commercially available as product number "B38/4000" from the 3M Company of St. Paul, Minn.) were degreased/etched by sequential immersing the bubbles for 10 minutes in each of trichloroethylene, EtOH, deionized water, 2% HF, and deionized water. Referring to the FIGURE, the degreased/etched bubbles were loaded into reaction zone 14 of fluidized bed reactor (or quartz tube) 12 to a height of 3.8 cm. The volume of the bubbles was about 80 $cm^3$. The quartz tube was 41 cm long and 5.1 cm in diameter.

Nitrogen gas, at a flow rate of 1.7 liter/min. was fed though gas inlet 16, and at a flow rate of 0.8 liter/min. was fed through gas inlet 17, to reaction zone 14 to fluidize bubbles 30. While the nitrogen was flowing, the temperature of reaction zone 14 was raised to 700° C. over 2 hours, at a heating rate of 5.6° C./min. After the 700° C. temperature was reached, the flow of nitrogen was turned off and reactive gases were admitted into the chamber. At this point, the reactive gases served to fluidize the bed.

Gaseous aluminum chloride was generated by passing hydrogen gas at a flow rate of 0.33 liter/min. over anhydrous aluminum chloride at approximately 150° C. The aluminum chloride, carried by the hydrogen, was fed into reaction zone 14 via gas inlet 17. Ammonia and hydrogen gases were fed into reaction zone 14 via gas inlet 16 at the flow rates of 0.2 liter/min. and 0.8 liter/min., respectively, with a combined flow rate of 1 liter/min.

About 10 minutes after the reactive gases were fed into reaction zone 14, the temperature of reaction zone 14 was raised from 700° C. to 800° C. The 800° C. temperature was maintained for about 10 minutes, after which time the flow of reactive gases and the supply of heat to reaction zone 14 were turned off, and hydrogen gas was fed into reaction zone 14 at a flow rate of 2 liters/min. via gas inlets 16 and 17. The coated bubbles cooled to room temperature in about 2 hours. After cooling, the coated bubbles were removed from the reaction zone.

The coated bubbles were free-flowing. Coated bubbles viewed at 42× using optical microscopy appeared to be smooth-surfaced, clear, transparent, and spherical. Auger surface analysis of the coated bubbles identified aluminum and nitrogen concentrations on the surface of the bubbles and an aluminum nitride deposition depth (i.e., coating thickness) of about 500° A.

Example 2

Example 2 composite bubbles were prepared as described in Example 1 except for the following. The temperature of reaction zone 14 was raised to 500° C. (at 5° C./min.) rather than to 700° C. Ammonia gas was fed at a flow rate of 0.9 liter/min. via gas inlet 16 rather than ammonia and hydrogen together as in Example 1. About 10 minutes after the reactive gases were fed into reaction zone 14, the temperature in reaction zone 14 was raised from 500° C. to 750° C. The 750° C. temperature was maintained for 1 hour.

The coated bubbles were free-flowing. Coated bubbles viewed at 42× using optical microscopy appeared to be opaque and spherical. Auger surface analysis of the coated bubbles identified aluminum and nitrogen concentrations on the surface of the bubbles and an aluminum nitride deposition depth of over 1000° A. Examination of a cross section of a composite bubble (i.e., a fractured bubble wall) using scanning electron microscopy revealed that the as-deposited aluminum nitride coating had a columnar microstructure. Further, such examination showed that the coating included many flat-topped and some pointed hexagonal pyramids.

X-ray powder diffraction (XRD) is a technique used to determine the presence of crystalline phases. XRD identified crystalline aluminum nitride on amorphous bubbles. Based on the broadening of the x-ray diffraction line, the sizes of individual AlN crystallites were 161° A (100), 224° A (002), and 145° A (101), respectively.

Example 3

Example 3 composite bubbles were prepared as described in Example 1 except for the following. The flow rates of the ammonia and hydrogen gases fed into reaction zone 14 via gas inlet 16 were 0.2 liter/min. and 0.7 liter/min., respectively. After 20 minutes of heating to 700° C. with the reactive gases flowing into reaction zone 14, the flow of reactive gas was turned off, and the reaction chamber was heated to 900° C. under hydrogen at a flow rate of 2 liters/min. After the chamber temperature reached 900° C, the reactive gases again were admitted to the chamber. Gaseous aluminum chloride was fed into the top of reaction zone 14 by hydrogen gas (at a flow rate of 0.33 liter/min.) via inlet 17. Ammonia and hydrogen gases were fed at flow rates of 1.0 liter/min. and 0.1 liter/min., respectively, into the bottom of reaction zone 14. The 900° C. temperature was maintained for about 37 minutes, after which time the flow of reactive gases and the supply of heat to reaction zone 14 were turned off, and hydrogen gas fed into reaction zone 14 at a flow rate of 2 liters/min. via gas inlets 16 and 17. The coated bubbles cooled to room temperature in about 2 hours. After cooling, the coated bubbles were removed from the reaction zone.

The coated bubbles were free-flowing. Coated bubbles viewed at 42× using optical microscopy appeared to be translucent and spherical.

XRD analysis of the coated bubbles identified [AlN][100] in the coating. Based on the broadening of the x-ray diffraction line measured at half its maximum intensity, the sizes of individual crystallites of AlN were 133° A (100) and 153° A (101), respectively. XRD also identified [alpha-cristobalite][63] in the bubbles. It is believed this crystalline phase was present due to devitrification of the glass bubbles.

Auger surface analysis indicated aluminum and nitrogen concentrations on the surface of the bubbles and an aluminum nitride deposition depth of over 500° A.

Example 4

Example 4 composite bubbles were prepared as described in Example 1, except as follows. The bubbles were not cleaned before being loaded into reaction zone 14. The flow rates of the ammonia and hydrogen gases fed into reaction zone 14 via gas inlet 16 were 0.5 liter/min. and 0.5 liter/min., respectively. After 20 minutes of heating to 700° C. with the reactive gases flowing into reaction zone 14, the temperature was raised to 800° C. and held for one hour. Then the flow of reactive gas was turned off, and hydrogen at a flow rate of 2 liters/min. was fed into the reaction zone via gas inlets 16 and 17. The coated bubbles cooled to room temperature in about 2 hours. After cooling, the coated bubbles were removed from the reaction zone.

The coated bubbles were free-flowing. Coated bubbles viewed at 42× using optical microscopy appeared to be translucent and spherical.

XRD analysis of the coated bubbles identified [AlN][80] in the coating. Based on the broadening of the x-ray diffraction line measured at half its maximum intensity, the sizes of individual crystallites of AlN were 234° A (100), 216° A (002), and 150° A (101) respectively. XRD analysis also identified [alpha-cristobalite][100] and an amorphous phase in the bubbles. It is believed that these phases are due to partial devitrification of the glass bubbles. This devitrification is expected at reaction temperatures of 800° C.

Auger surface analysis indicated aluminum and nitrogen concentrations on the surface of the bubbles and a deposition depth of over 1000° A.

Example 5

The Example 5 composite bubble were prepared as described in Example 4 except the reaction zone was maintained at the single temperature of 700° C. after the reactive gases were admitted to the chamber. After cooling, the coated bubbles were removed from the reaction zone.

The coated bubbles were free-flowing. Coated bubbles viewed at 42× using optical microscopy appeared to be translucent and spherical.

XRD analysis of the coated bubbles identified [AlN] crystal phases in the coating. Based on the broadening of the x-ray diffraction line measured at half its maximum intensity, the sizes of individual crystallites of AlN were 140° A (100), 280° A (002), and 140° A (101), respectively. XRD analysis also indicated the presence of an amorphous phase due to the glass bubbles.

Example 6

Silicate glass bubbles (75–80% $SiO_2$, 5–8% CaO, 8–12% $Na_2O$, 0–1% $P_2O_5$, 1–3% ZnO, and less than 0.5% $SO_3$; ranging in diameter from 2 to 150 micrometers; commercially available as product number "D32/4500" from the 3M Company of St. Paul, Minn.) were screened through 325 mesh (44 micrometer) standard sieve. Bubbles passing through the sieve (i.e., smaller than 44 micrometers) were loaded into reaction zone 14 of fluidized bed reactor 12 to a height of 5.1 cm. Nitrogen gas was fed in through gas inlet 16 at 1.0 liter/min. and through gas inlet 17 at 0.2 liter/min. While nitrogen was flowing, the temperature of the chamber was raised to 700° C. at a rate of 11.25° C./min. After the 700° C. temperature was reached, the flow of nitrogen was turned off and reactive gases were admitted into the chamber. At this point, the reactive gases served to fluidize the bed.

Gaseous aluminum chloride, ammonia, and hydrogen gases were fed into the reaction zone as described in Example 4, except that the temperature was held at 700° C. for one hour. Then the flow of reactive gas was turned off, and hydrogen at a flow rate of 2 liters/min. was fed into the reaction zone via gas inlets 16 and 17. The coated bubbles cooled to room temperature in about 2 hours. After cooling, the coated bubbles were removed from the reaction zone.

The coated bubbles were free-flowing. Coated bubbles viewed at 42× using optical microscopy appeared to be transparent and spherical.

XRD analysis of the coated bubbles identified an aluminum nitride crystalline phase, and amorphous phase, and NaCl.

Example 7

The method of Example 7 was as described in Example 4 except that the reaction zone was maintained at the temperature of 700° C. for 2 hours after the reactive gases were admitted to the chamber, and then the temperature was raised to 900° C. and held for one hour. Next, the reaction zone was allowed to cool as described in Example 4. After cooling, the coated bubbles were removed from the reaction zone.

The coated bubbles free-flowing. Coated bubbles viewed at 42× using optical microscopy appeared to be spherical; the coating ranged from transparent to opaque.

XRD analysis of the coated bubbles identified [AlN]$^{100}$ in the coating. XRD analysis also identified [alpha-cristobalite]$^{63}$ in the bubbles. It is believed that this phase is due to the devitrification of the glass bubbles.

Examination of a cross section of a composite bubble (i.e., a fractured bubble wall) using scanning electron microscopy indicated the aluminum nitride coating had thicknesses ranging from 0.1 to 0.2 micrometers.

Example 8

Sodium borosilicate glass bubbles (67–70% $SiO_2$, 20–22% $Na_2O$, 6.9–10.7% $B_2O_3$, 0.07–0.1% $Al_2O_3$, 0.6–0.7, 0.6–0.7% $SO_3$; ranging in diameter from 2 to 100 micrometers; commercially available under the trade designation "Q-CEL 2106" from PQ Corporation of Valley Forge, Pa.) were fired at 450° C. for 3 hours in a furnace to burn off organic materials.

The bubbles were loaded into reaction zone 14 of fluidized bed reactor 12 to a height of 5.1 cm. Nitrogen gas was fed in through gas inlet 16 at 1.0 liter/min., and through gas inlet 17 at 0.2 liter/min. The composite bubbles were prepared as described in Example 4 except as follows. The temperature of reaction zone 14 was raised to 450° C. at a rate of 7.1° C./min. and held at this temperature for 40 minutes, and then heated to 800° C. at a rate of 5.8° C./min. This 800° C. temperature was held for 5 minutes. The flow of ammonia and hydrogen gases were turned off, and hydrogen at a flow rate of 2 liters/min. was fed into reaction zone 14 via gas inlets 16 and 17. The coated bubbles were cooled to room temperature in about 2 hours. After cooling, the coated bubbles were removed from the reaction zone.

The coated bubbles were free-flowing. Coated bubbles viewed at 42× using optical microscopy appeared to be spherical and opaque.

XRD analysis of the coated bubbles identified [AlN]$^{13}$, an unidentified amorphous phase, and [NaCl]$^{100}$ in the coating.

Example 9

Silicate glass bubbles ("B38/4000") were screened through at 325 mesh (44 micrometer) standard sieve. Bubbles smaller than 44 micrometers were loaded into reaction zone 14 of fluidized bed reactor 12 to a height of 3.8 cm.

Nitrogen gas was fed in through gas inlet 16 at 1.0 liter/min. and through gas inlet 17 at 0.2 liter/min. While the nitrogen was flowing, the temperature of reaction zone 14 was raised to 700° C. at a rate of 11.25° C./min. After the 700° C. temperature was reached, the flow of nitrogen was turned off and reactive gases were admitted into the reaction zone as described in Example 4.

After one hour of heating at 700° C. with the reactive gases flowing into reaction zone 14, the temperature was raised to 900° C. at a rate of 3.3° C./min., and then held at 900° C. for one hour. The flow of reactive gas was then turned off, and hydrogen at a flow rate of 0.7 liters/min. was fed into reaction zone 14 via gas inlet 16. Further, nitrogen was fed into reaction zone 14 via gas inlet 17 at a flow rate of 0.4 liter/min. The coated bubbles cooled to room temperature in about 2 hours. After cooling, the coated bubbles were removed from the reaction zone.

The coated bubbles were free-flowing. Coated bubbles viewed at 42× using optical microscopy appeared to be translucent and spherical.

XRD analysis of the coated bubbles identified [AlN]$^{100}$, an unidentified amorphous phase, and [NaCl]$^{13}$ in the coating. XRD analysis also identified alpha-cristobalite in the bubbles.

Example 10

A composite material containing 48% by volume bubbles was prepared by adding composite bubbles prepared as described in Example 5 to a liquid epoxy resin (diglycidylether of bisphenol A) (commercially available from Dow Chemical of Midland, Mich. under the trade designation "QUATREX 1010"), to which 4% by weight dicyandiamide amine curing agent (commercially available from Pacific Anchor Div. of Air Products Co., Allen Town, Pa.) had been added.

The resin/bubble mixture was agitated for about 10 minutes by stirring with a mechanical stirrer while heating at 100° C. in a oil bath. After heating and stirring it was placed in a 3-necked flask. Vacuum (about 10 torr) was applied for about 2 hours to degas the resin/bubble mixture. While this mixture was under reduced pressure, agitation continued intermittently by means of mechanical stirring. It was desirable to keep the bubbles homogeneously distributed in the epoxy resin matrix; stirring facilitated this. The viscous resin/bubble mixture was poured into a rectangular mold of dimension 10.2 cm×20.4 cm×0.32 cm (4"×8"×⅛") and then cured at 177° C. for 3 hours in an laboratory oven.

Epoxy resin-bubble composites were die cut to make discs, 0.32 cm (⅛") thick and 3.8 cm (1.5") in diameter. The thermal conductivity of the discs was measured at selected temperatures. Further, Comparative A composite materials were prepared as described for Example 10 except the bubbles did not include the AlN coating. The thermal conductivity of the Comparative A composite material was also measured at selected temperatures.

Thermal conductivity was measured by using a thermal conductivity meter (commercially available under the trade designation "C-Matic" Conductivity Meter from Dynatech Corp. of Cambridge, Mass.). A 3.8 cm diameter, 0.3 cm thick disc of material was placed into the chamber and compressed between two plates at 207 Pa (30 psi) of pressure. A thermal conductor (alumina plus silicone oil) was spread onto the sample to ensure complete contact with the plates. Heat was applied to the bottom plate. This measurement determines how much energy is required to obtain a 30° C. temperature difference between the top and bottom plates.

Data capture and determination of equilibrium were performed with the aid of a remote (Hewlett Packard (HP) 87) computer. A 4.4° C. (40° F.) temperature gradient was maintained through the sample; therefore, the reported temperature of the sample was the average temperature across the gradient.

This procedure is modified from ASTM C-518, the disclosure of which is incorporated by reference. The modification is made to accommodate small test samples of high thermal conductivity.

The results of the thermal conductivity measurements are shown in Table 1, below.

TABLE 1

| Example | Average temp., °C. | Thermal conductivity, W/m °C. |
| --- | --- | --- |
| 10 | 43.3 | 0.190 |
| 10 | 73.9 | 0.201 |
| 10 | 102.9 | 0.218 |
| 10 | 130.6 | 0.231 |
| 10 | 157.4 | 0.240 |
| Comp. A | 44.8 | 0.122 |
| Comp. A | 75.3 | 0.130 |
| Comp. A | 104.1 | 0.139 |
| Comp. A | 132.0 | 0.150 |
| Comp. A | 158.8 | 0.157 |

Comparison of composite materials made with uncoated bubbles and composite bubbles show that the thermal conductivity is higher for the composite containing the AlN coated bubbles.

The composite materials containing composite bubbles had a smooth surface, without the presence of pits or air bubbles, indicating, it is believed, thorough wetting of the composite bubbles by the resin mixture. Further, it is believed that the coating on the bubbles prohibits ionic impurities from the glass from migrating into the resin during the curing process. It is also believed such impurities may create flaws in the cured composite. By contrast, the composite containing the uncoated bubbles had a very rough surface, with many air bubbles and pits.

Example 11

A composite material was prepared as described above in Example 10 except the composite bubbles were prepared as described in Example 6. The thermal conductivity of the composite material was measured at selected temperatures as described in Example 10. The results of the thermal conductivity measurements are shown in Table 2, below.

TABLE 2

| Example | Average temp, °C. | Thermal conductivity, W/m°C. |
| --- | --- | --- |
| 11 | 44.7 | 0.156 |
| 11 | 75.1 | 0.167 |
| 11 | 104.1 | 0.180 |
| 11 | 131.7 | 0.190 |
| 11 | 158.6 | 0.203 |

Examples 12–14

Three composite materials comprising 38 (Example 12), 48 (Example 13), and 57 (Example 14) volume percent bubbles were prepared as described in Example 10 except the composite bubbles were prepared as described in Example 7. The thermal conductivity of each composite material was measured at various temperatures. The thermal conductivity of a composite material made with uncoated bubbles (at 48 volume percent), Comparative B, was also measured. The results of the thermal conductivity measurements are shown in Table 3, below.

TABLE 3

| | Thermal Conductivity (W/mC) | | | |
| --- | --- | --- | --- | --- |
| Average temp., °C. | Example 12 | Example 13 | Example 14 | Comp. B |
| 44.8 | 0.177 | 0.203 | 0.211 | 0.122 |
| 75.3 | 0.205 | 0.215 | 0.220 | 0.130 |
| 104.1 | 0.222 | 0.231 | 0.236 | 0.139 |
| 132.0 | 0.239 | 0.249 | 0.257 | 0.150 |
| 158.8 | 0.252 | 0.255 | 0.267 | 0.157 |

The data show that the thermal conductivity increases as the volume percent loading of aluminum nitride in the composite bubbles increases.

The composite materials containing composite bubbles were smooth and appeared to be flawless, without the presence of pits or air bubbles, whereas the composite material containing the uncoated bubbles had very rough surfaces, with many air bubbles and pits.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. A composite bubble comprising (a) a bubble of a silicate glass having a softening point of less than 900° C., said bubble having an outer surface, and (b) aluminum nitride coated onto 100% of said outer surface of said bubble.

2. The composite bubble according to claim 1 wherein said aluminum nitride is polycrystalline.

3. The composite bubble according to claim 1 wherein said aluminum nitride has an average thickness less than 1.5 micrometer.

4. The composite bubble according to claim 1 wherein said aluminum nitride has an average thickness in the range from 0.1 to 1.5 micrometer.

5. The composite bubble according to claim 1 wherein said aluminum nitride has an average thickness in the range from about 0.1 to about 0.3 micrometer.

6. The composite bubble according to claim 1 wherein said bubble of silicate glass has a diameter in the range from about 2 to about 200 micrometers.

7. The composite bubble according to claim 1 wherein said silicate glass has a softening point less than 750° C.

8. The composite bubble according to claim 1 wherein said silicate glass include, on a theoretical oxide basis, greater than zero to 15 percent by weight $Na_2O$ and greater than zero to 10 percent by weight $B_2O_3$, based on the total weight of said silicate glass.

9. The composite bubble according to claim 1 wherein said silicate glass includes, on a theoretical oxide basis, greater than zero to 10 percent by weight CaO, based on the total weight of said silicate glass.

10. The composite bubble according to claim 1 wherein said bubble of silicate glass has a diameter in the range from about 2 to about 40 micrometers.

11. A composite article comprising epoxy resin and a plurality of composite bubbles according to claim 10.

12. A composite article comprising epoxy resin and a plurality of composite bubbles according to claim 1.

13. A composite bubble comprising (a) a bubble of a silicate glass-ceramic, said bubble having an outer surface, and said silicate glass-ceramic comprising at least 2% by weight of silicate glass having a softening point of less than 900° C., and (b) aluminum nitride coated onto 100% of said outer surface of bubble.

14. The composite bubble according to claim 13 wherein said aluminum nitride is polycrystalline.

15. The composite bubble according to claim 14 wherein said aluminum nitride has an average thickness in the range from 0.1 to 1.5 micrometer.

16. The composite bubble according to claim 14 wherein said aluminum nitride has an average thickness in the range from 0.1 to 0.3 micrometer.

17. The composite bubble according to claim 14 wherein said bubble of silicate glass-ceramic has a diameter in the range from about 2 to about 200 micrometers.

18. The composite bubble according to claim 14 wherein said silicate glass has a softening point less than 750° C.

19. The composite bubble according to claim 14 wherein said silicate glass includes, on a theoretical oxide basis, greater than zero to 15 percent by weight $Na_2O$ and greater than zero to 10 percent by weight $B_2O_3$, based on the total weight of said silicate glass.

20. The composite bubble according to claim 14 wherein said silicate glass includes, on a theoretical oxide basis, greater than zero to 10 percent by weight CaO, based on the total weight of said silicate glass.

21. The composite bubble according to claim 14 wherein said bubble of silicate glass-ceramic has a diameter in the range from about 2 to about 40 micrometers.

22. A composite article comprising epoxy resin and a plurality of composite bubbles according to claim 21.

23. A composite article comprising epoxy resin and a plurality of composite bubbles according to claim 14.

24. The composite bubble according to claim 13 wherein said aluminum nitride has an average thickness less than 1.5 micrometer.

25. A method for making a plurality of composite bubbles, said method comprising the steps of:

(a) providing a plurality of bubbles, the bubbles being selected from the group consisting of (i) silicate glass bubbles having a softening point up to 900° C., and having an outer surface, (ii) silicate glass-ceramic bubbles comprising at least 2% by weight silicate glass having a softening point up to 900° C., and having an outer surface, and (iii) combinations thereof; and (b) depositing aluminum nitride on the plurality of bubbles by chemical vapor deposition at a temperature below the softening point of the silicate glass to provide a plurality of free flowing composite bubbles, wherein each composite bubble comprises one of said bubbles with aluminum nitride coated onto the outer surface thereof, wherein at least a portion of said silicate glass bubbles or silicate glass-ceramic bubbles have said aluminum nitride coated onto at least 90 percent of the outer surfaces.

26. The method according to claim 25 wherein at least a portion of said silicate glass bubbles or silicate glass-ceramic bubbles have said aluminum nitride coated onto at least 100 percent of the outer surfaces.

27. A method for making a plurality of composite bubbles, said method comprising the steps of:

(a) providing a plurality of silicate glass-ceramic bubbles comprising at least 2% by weight silicate glass having a softening point up to 900° C.; and (b) depositing aluminum nitride on said plurality of bubbles by chemical vapor deposition at a temperature below the softening point of the silicate glass to provide a plurality of free flowing composite bubbles, wherein each composite bubble comprises one of said bubbles with aluminum nitride coated onto the outer surface thereof, wherein at least a portion of said silicate glass-ceramic bubbles have said aluminum nitride coated onto at least 90 percent of the outer surfaces.

28. The method according to claim 27 wherein at least a portion of said silicate glass-ceramic bubbles have said aluminum nitride coated onto at least 100 percent of the outer surfaces.

* * * * *

UNITED STATES PATENT AND TRADEMARK OFFICE
CERTIFICATE OF CORRECTION

PATENT NO.: 5,691,059
DATED: November 25, 1997
INVENTOR(S): Kyung H. Moh

It is certified that error appears in the above-identified patent and that said Letters Patent is hereby corrected as shown below:

| | |
|---|---|
| Col. 1, line 55 | "organ-metallic" should read --organometallic-- |
| Col. 2, line 35 | delete "is" after the word "glass" |
| Col. 5, line 7 | delete "are" after the word "sources" |
| Col. 5, line 23 | "900°C." should read --900°C).-- |
| Col. 5, line 38 | delete "are" after the word "which" |
| Col. 6, line 56 | "1000° A" should read --1000 Å-- |
| Col. 7, line 20 | "minimizes" should read --minimize-- |
| Col. 7, line 32 | after "can" insert --be-- |
| Col. 9, line 13 | "1000° A" should read --1000 Å-- |
| Col. 9, line 23 | "161° A" and "224° A" should read --161 Å-- and --224 Å-- |
| Col. 9, line 24 | "145° A" should read --145 Å-- |

UNITED STATES PATENT AND TRADEMARK OFFICE
CERTIFICATE OF CORRECTION

PATENT NO.: 5,691,059
DATED: November 25, 1997
INVENTOR(S): Kyung H. Moh

It is certified that error appears in the above-identified patent and that said Letters Patent is hereby corrected as shown below:

| | |
|---|---|
| Col. 9, line 56 | "133° A" and "153° A" should read --133 Å-- and --153 Å-- |
| Col. 9, line 62 | "500° A" should read --500 Å-- |
| Col. 10, line 18 | "234° A" and "216° A" should read --234 Å-- and --216 Å-- |
| Col. 10, line 19 | "150° A" should read --150 Å-- |
| Col. 10, line 26 | "1000° A" should read --1000 Å-- |
| Col. 10, line 42 | "140° A", "280° A" and "140° A" should read --140 Å--, --280 Å-- and --140 Å-- |
| Col. 11, line 21 | after "bubbles" insert --were-- |
| Col. 12, line 39 | "a" should read --an-- |
| Col. 12, line 48 | "an" should read --a-- |

Signed and Sealed this

Fifteenth Day of May, 2001

Attest:

NICHOLAS P. GODICI

Attesting Officer

Acting Director of the United States Patent and Trademark Office